United States Patent
Zou et al.

(10) Patent No.: US 9,510,477 B1
(45) Date of Patent: Nov. 29, 2016

(54) SERVER

(71) Applicant: WISTRON CORP., New Taipei (TW)

(72) Inventors: Zhi-Peng Zou, New Taipei (TW); Zhong-Hui Mao, New Taipei (TW)

(73) Assignee: WISTRON CORP., New Taipei (TW)

( * ) Notice: Subject to any disclaimer, the term of this patent is extended or adjusted under 35 U.S.C. 154(b) by 0 days.

(21) Appl. No.: 14/883,255

(22) Filed: Oct. 14, 2015

(30) Foreign Application Priority Data

Jun. 17, 2015 (CN) .......................... 2015 1 0342358

(51) Int. Cl.
*H05K 5/03* (2006.01)
*H05K 7/14* (2006.01)
*H05K 5/02* (2006.01)
*H05K 5/00* (2006.01)

(52) U.S. Cl.
CPC .......... *H05K 7/1489* (2013.01); *H05K 5/0013* (2013.01); *H05K 5/0239* (2013.01); *H05K 5/0247* (2013.01); *H05K 5/03* (2013.01); *H05K 7/1492* (2013.01)

(58) Field of Classification Search
CPC ............ H05K 7/1489; H05K 7/1492; H05K 7/1474; H05K 7/1401; H05K 7/1404; H05K 7/1405; H05K 7/1431; H05K 7/1432; H05K 7/1457; H05K 7/2049; H05K 5/0013; H05K 5/0239; H05K 5/0247; H05K 5/03; H05K 5/0004; H05K 5/0208; H05K 9/0009; H05K 9/0016; H05K 9/0015; H05K 9/0067; G11B 33/123; G11B 33/124; G11B 33/127; G11B 33/027; G11B 33/1493; G11B 33/08; Y10T 292/0894; Y10T 292/0899; Y10T 292/0903; Y10T 292/0907
See application file for complete search history.

(56) References Cited

U.S. PATENT DOCUMENTS

| | | | | |
|---|---|---|---|---|
| 5,138,529 A * | 8/1992 | Colton | ..................... | G06F 1/184 24/295 |
| 5,746,326 A * | 5/1998 | Hong | ................... | H05K 9/0016 211/41.17 |
| 6,879,496 B1 * | 4/2005 | Marshall | .............. | H05K 9/0015 174/377 |
| 7,619,169 B1 * | 11/2009 | Ho | ....................... | H05K 9/0016 174/354 |
| 8,864,183 B1 * | 10/2014 | Mason | ..................... | H05K 5/03 292/1 |
| 2007/0227939 A1 * | 10/2007 | Chen | ...................... | G06F 1/182 206/701 |
| 2009/0061683 A1 * | 3/2009 | Ball | ..................... | H05K 9/0016 439/607.01 |
| 2011/0297628 A1 * | 12/2011 | Gong | ................... | H05K 7/1489 211/26 |
| 2012/0079694 A1 * | 4/2012 | Anders | .............. | B60R 11/0211 29/281.1 |
| 2013/0169129 A1 * | 7/2013 | Chai | .................... | H05K 5/0013 312/223.2 |
| 2014/0042883 A1 * | 2/2014 | Lin | ...................... | H05K 5/0004 312/223.1 |
| 2014/0062273 A1 * | 3/2014 | Lee | ...................... | H05K 5/0221 312/223.1 |

* cited by examiner

*Primary Examiner* — Courtney Smith
*Assistant Examiner* — Christopher L Augustin
(74) *Attorney, Agent, or Firm* — Maschoff Brennan

(57) ABSTRACT

A server includes a chassis, a protecting component and at least one power supply. The chassis includes a case, a cover and a lid. The cover is disposed on the case to form at least one accommodating space, and the lid is detachably disposed on the case and covers the cover. The protecting component is assembled on the cover and includes a pressed sheet spring and a first blocking sheet spring. Both the pressed sheet spring and the first blocking sheet spring includes a bending section, and the bending sections are separated apart. The two sheet springs are fastened to the cover to form a fastening part, and the two sheet springs are connected to each other to form a movable part. The two sheet springs move simultaneously when the movable part is moved relative to the cover. The power supply is removably disposed in the accommodating space.

15 Claims, 16 Drawing Sheets

SERVER

CROSS-REFERENCE TO RELATED APPLICATIONS

This non-provisional application claims priority under 35 U.S.C. §119(a) on Patent Application No(s). 201510342358.7 filed in China on Jun. 17, 2015, the entire contents of which are hereby incorporated by reference.

TECHNICAL FIELD

The disclosure relates to a server, more particularly to a server having a removable power supply and a protecting component for preventing electric shock.

BACKGROUND

In recent year, people have used personal computers, such as desktop computers and laptops, for dealing with routine matters. With the development of communication technology, regional electronic commerce has been evolved into international electronic commerce so that the conventional personal computers are unable to satisfy the requirements in the market. Therefore, different kinds of servers, such as 2U server, rack server and blade server, are provided to satisfy the requirements of international electronic commerce.

Generally, the server can be provided with a removable power supply for the convenience of maintaining, upgrading and transporting the server. However, when a user is maintaining, upgrading or transporting the server with the power supply turning on, an electric shock easily occurs to injury the user.

SUMMARY

According to the disclosure, a server includes a chassis, a protecting component and at least one power supply. The chassis includes a case, a cover and a lid. The cover is disposed on the case so as to form at least one accommodating space. The lid is detachably disposed on the case and covers the cover. The protecting component is assembled on the cover and includes a pressed sheet spring and a first blocking sheet spring. Both the pressed sheet spring and the first blocking sheet spring includes a bending section, and the bending sections face each other with a distance between the bending sections. An end of the pressed sheet spring and an end of the first blocking sheet spring are both fastened to the cover together so as to form a fastening part. The other end of the pressed sheet spring and the other end of the first blocking sheet spring are connected to each other so as to form a movable part. The pressed sheet spring and the first blocking sheet spring are bent or flattened simultaneously when the movable part being moved relative to the cover. The power supply is removably disposed in the accommodating space. When the lid is detached from the case, the bending sections are normally bent so that at least a part of the bending section of the first blocking sheet spring is protruded into the accommodating space so as to prevent the power supply from being disposed in the accommodating space. When the lid is disposed on the case, the lid presses and flattens the bending section of the pressed sheet spring so as to flatten the bending section of the first blocking sheet spring through the movable part moved relative to the cover; thereby, the bending sections are flattened due to movement of the movable part. The bending section of the first blocking sheet spring at the flattened state is removed from the accommodating space so that the power supply is capable of being disposed in the accommodating space.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
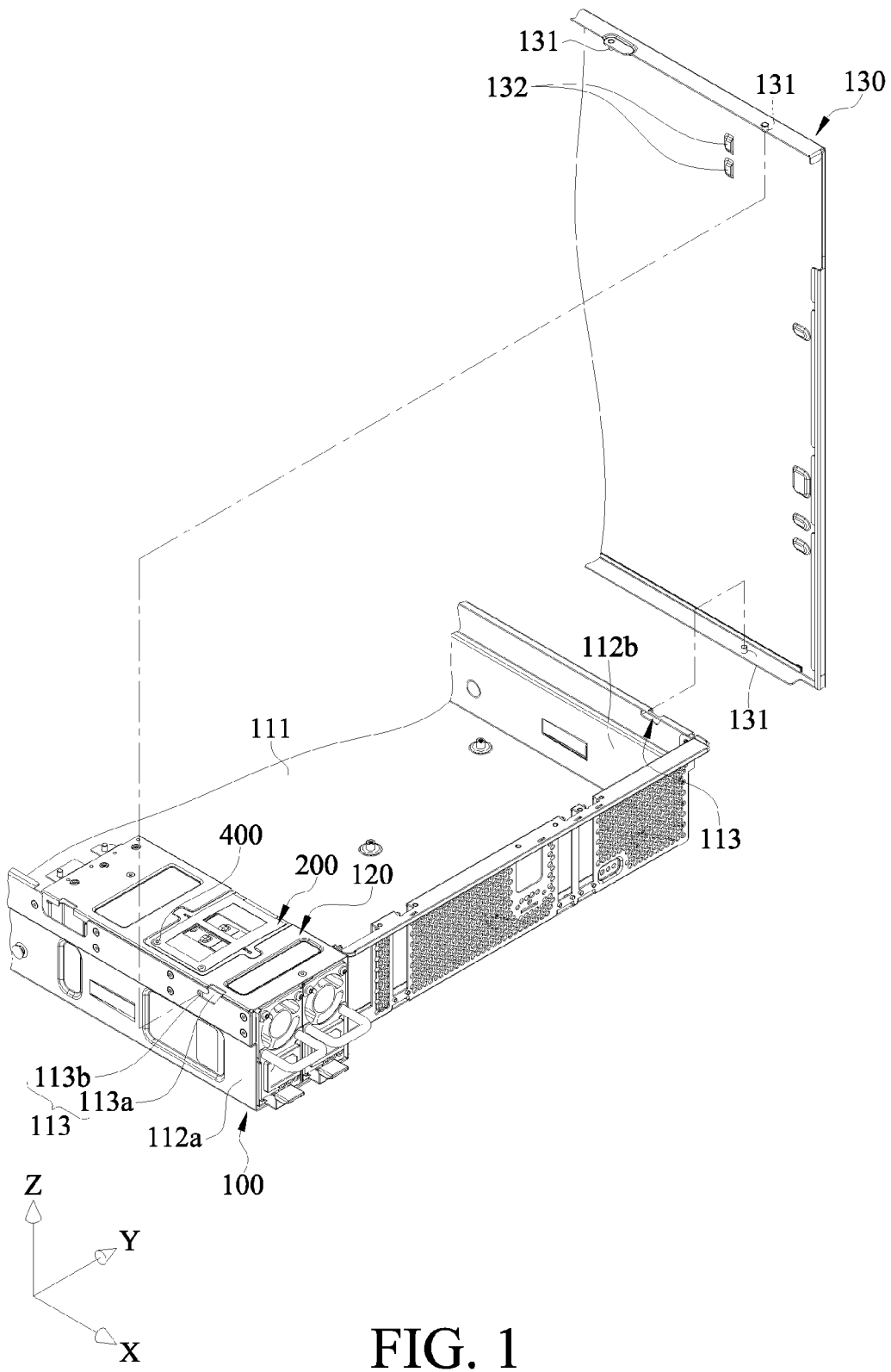
FIG. 1 is a perspective view of a server with a lid detached from a case according to a first embodiment.
Figure 2:
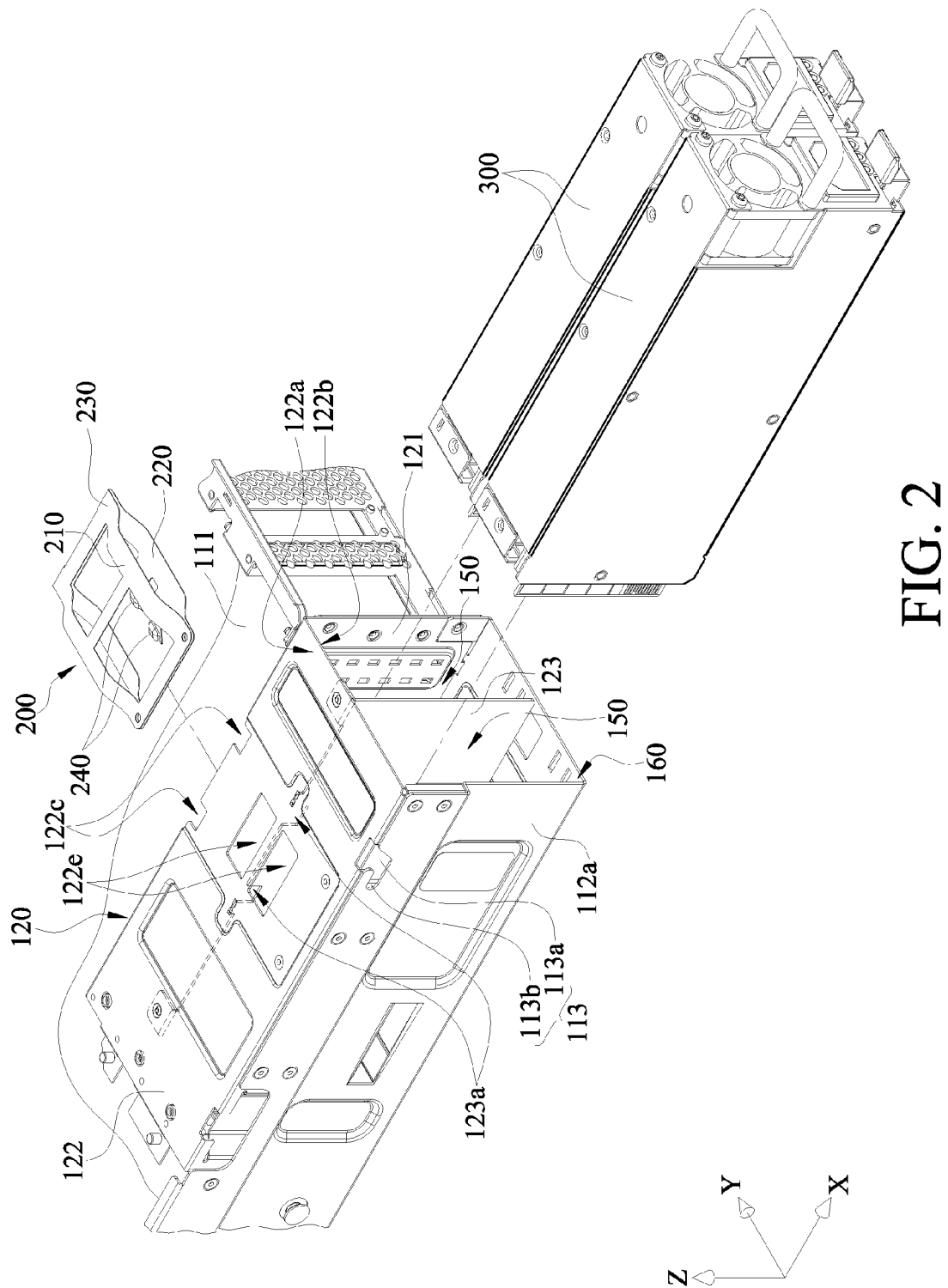
FIG. 2 is an exploded view of the server in FIG. 1.
Figure 3:
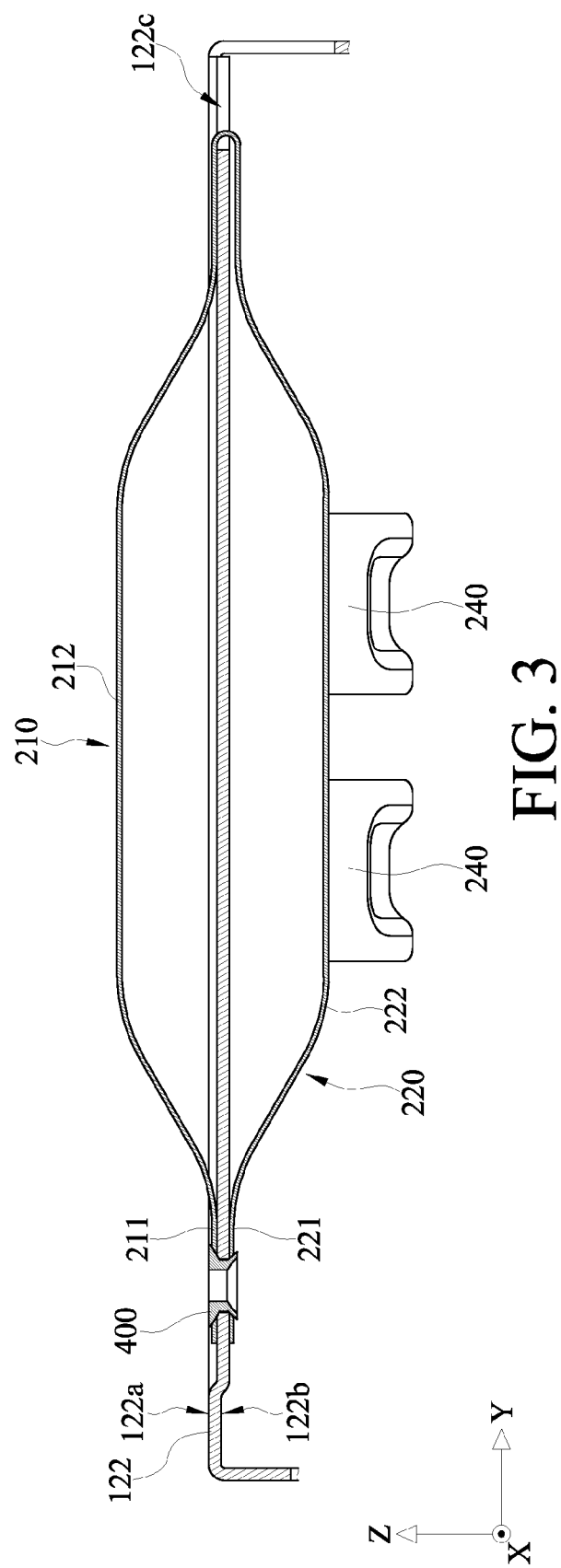
FIG. 3 is a cross-sectional view of a protecting component of the server assembled on the cover according to the first embodiment.
Figure 4:
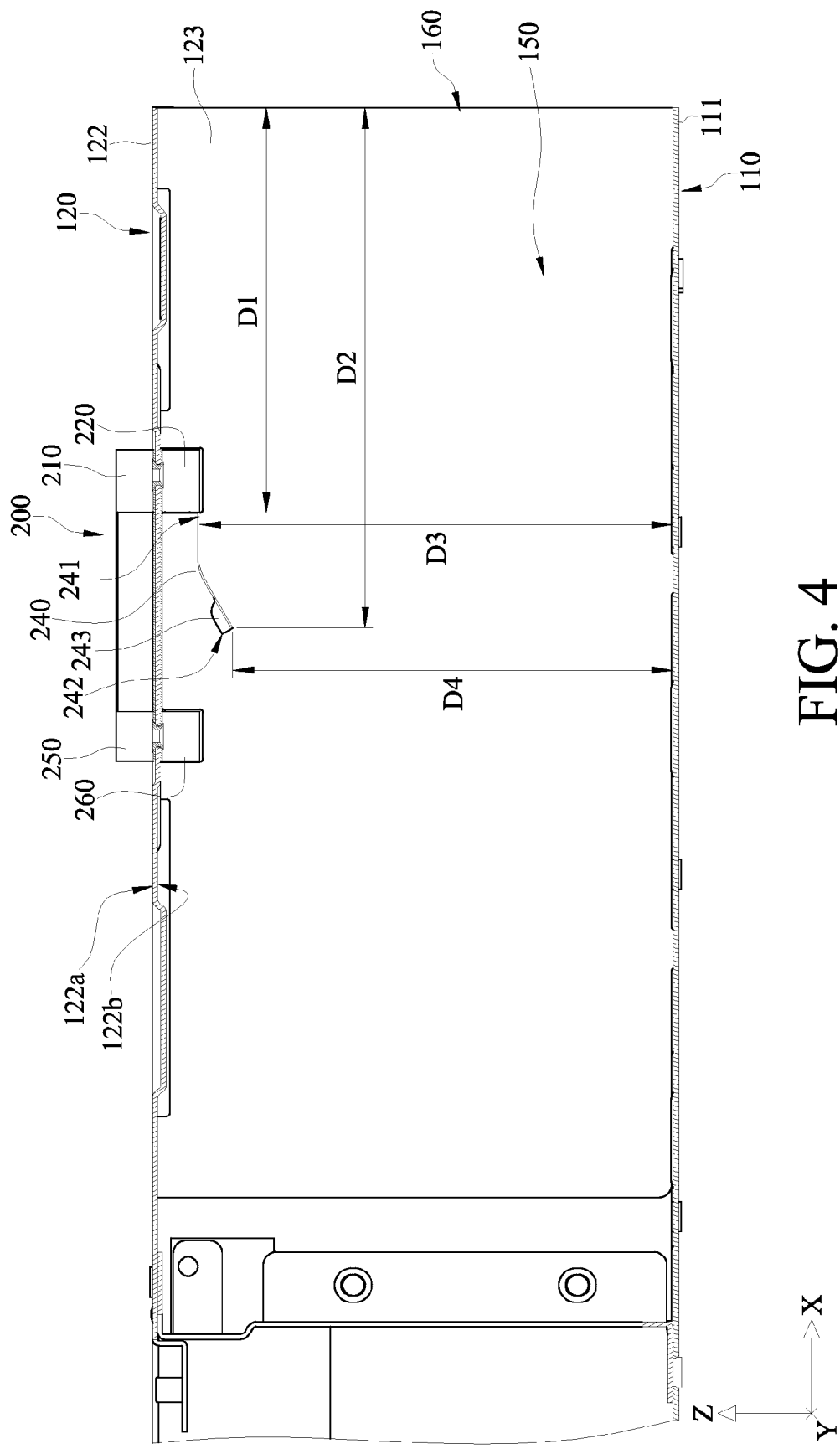
FIG. 4 is a cross-sectional view of the server with the protecting component assembled on the cover according to the first embodiment.

Please refer to FIG. 1 to FIG. 4. FIG. 1 is a perspective view of a server with a lid detached from a case according to a first embodiment. FIG. 2 is an exploded view of the server in FIG. 1. FIG. 3 is a cross-sectional view of a protecting component of the server assembled on the cover according to the first embodiment. FIG. 4 is a cross-sectional view of the server with the protecting component assembled on the cover according to the first embodiment. In this embodiment, a server 10 includes a chassis 100, a protecting component 200 and two power supplies 300.

The chassis 100 includes a case 110, a cover 120 and a lid 130. In order to clearly describe details in the following illustrations, three-dimensional coordinate systems are shown in the drawings as an auxiliary.

The case 110, for example, is for accommodating a hard disk (not shown) and a mother board (not shown). In detail, the case 110 includes a bottom board 111, a first side board 112a and a second side board 112b. Both the first side board 112a and the second side board 112b stand on a top surface of the base 111. Both the first side board 112a and the second side board 112b include a plurality of sliding grooves 113. The sliding grooves 113 are formed on a top edge of the first side board 112a and the second side board 112b, respectively. Each of the sliding grooves 113 includes a first sliding section 113a and a second sliding section 113b which are communicated with each other. In this embodiment, extending directions of the long sides of the first side board 112a and the second side board 112b is parallel to an X-axis of the coordinate system, an extending direction of the first sliding section 113a intersects with the X-axis of the coordinate system, and an extending direction of the second sliding section 113b is parallel to the X-axis.

The cover 120 is disposed on the case 110 so as to form at least one accommodating space 150. In detail, the cover 120 includes a side plate 121, a top plate 122 and a partition 123. The side plate 121 stands on the base 111 of the case 110, and the top plate 122 connects the side plate 121 and the first side board 112a. There is a distance between the top plate 122 and the base 111. The top plate 122 has a first surface 122a and a second surface 122b that are opposite to each other, and the second surface 122b faces the base 111 of the case 110. The partition 123 stands on the base 111 and is located between the top plate 122 of the cover 120 and the base 111 of the case 110 so that the base 111, the first side board 112a, the side plate 121, the top plate 122 and the partition 123 form two accommodating spaces 150 together. Each of the two accommodating spaces 150 has an opening 160. Furthermore, the top plate 122 has two guiding rails 122c and two first through holes 122e. The guiding rails 122c are located on a side of the top plate 122 further away from the first side board 112a than the other side, and the first through holes 122e are located between the guiding rails 122c and the first side board 112a. The partition 123 has two notches 123a located on an edge of the partition 123 further away from the base 111 than the other edge. The guiding rails 122c, the first through holes 122e and the notches 123a are for interacting with the protecting component 200, which is illustrated hereafter.

The lid 130 is detachably disposed on the case 110, and the lid 130 covers the cover 120. In detail, the lid 130 includes a plurality of sliders 131. The sliders 131 are slidably disposed in the sliding grooves 113, respectively. When the slider 131 slides into the second sliding section 113b through the first sliding section 113a along a disposing direction (the negative direction of the X-axis of the coordinate system), the lid 130 is securely disposed on the case 110. When the slider 131 along a detaching direction (the positive direction of the X-axis) to slide out of the sliding groove 113 through the first sliding section 113a, the lid 130 is detached from the case 110.

In this embodiment, the detaching direction of the lid 130 is along the positive direction of the X axis, but the disclosure is not limited thereto. In other embodiments, the detaching direction of the lid 130 can be along the negative direction of the X-axis.

Furthermore, the lid 130 further includes two first fastening components 132 located at a side of the lid 130 facing the base 111. The first fastening component 132, for example, is a protrusion corresponding to the protecting component 200. Details about the aforementioned relationships are illustrated thereafter.

Figure 5:
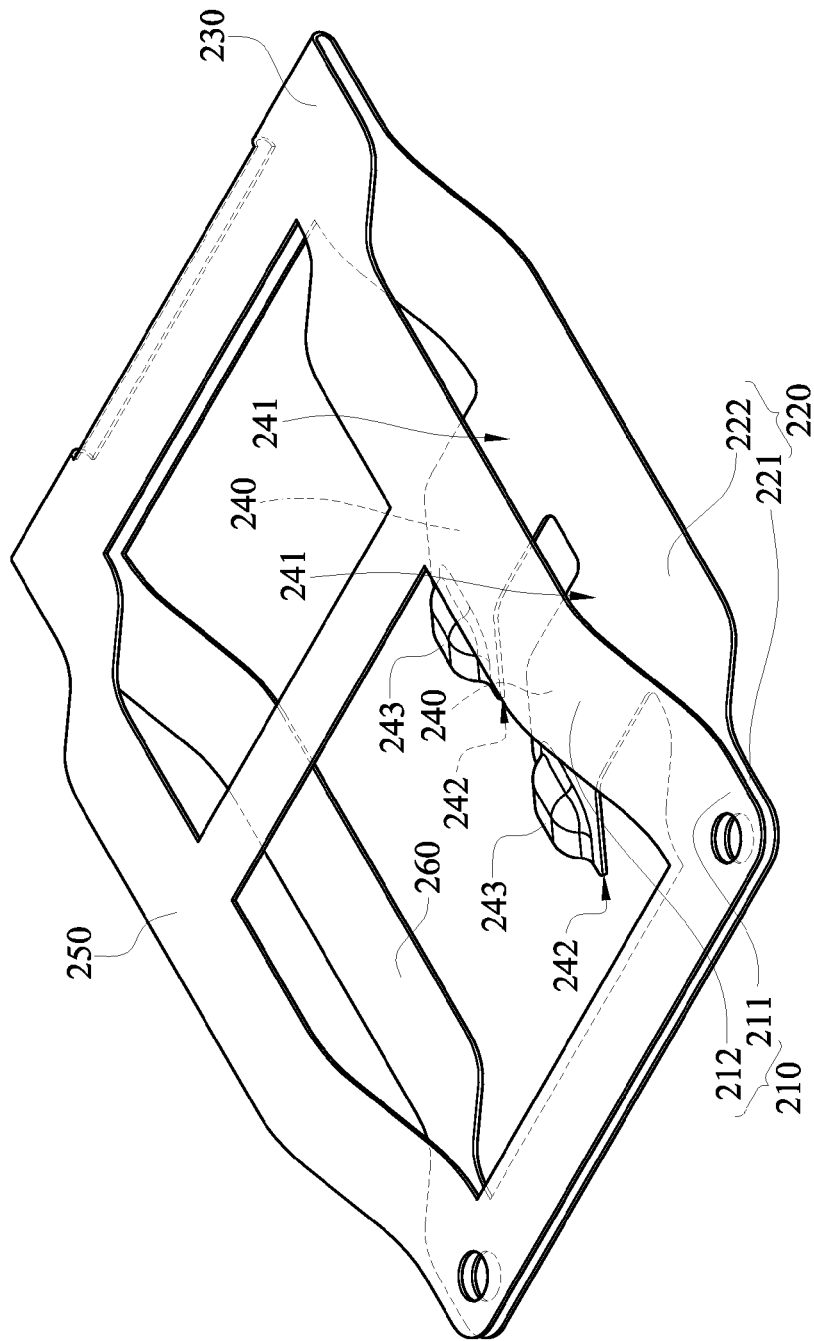
FIG. 5 is a perspective view of the protecting component in FIG. 2.

Please refer to FIG. 2 to FIG. 5. FIG. 5 is a perspective view of the protecting component in FIG. 2. The protecting component 200 includes a pressed sheet spring 210, a first blocking sheet spring 220 and a connecting sheet 230. The pressed sheet spring 210 includes a fastening section 211 and a bending section 212 connected to each other, and the first blocking sheet spring 220 includes a fastening section 221 and a bending section 222 connected to each other. The pressed sheet spring 210 and the first blocking sheet spring 220 are located on the same side of the connecting sheet 230 and face each other with a distance between the bending sections 212 and 221. The connecting sheet 230 connects the bending section 211 of the pressed sheet spring 210 and the bending section 221 of the first blocking sheet spring 220.

The top plate 122 of the cover 120 is interposed between the pressed sheet spring 210 and the first blocking sheet spring 220. That is, the pressed sheet spring 210 and the first blocking sheet spring 220 are located at two sides of the top plate 122 that are opposite to each other, respectively. The fastening section 211 and the fastening section 221 are fastened to the two opposite sides of the top plate 122 together, for example by a rivet, 400 so as to form a fastening part of the protecting component 200. The connecting sheet 230 is slidably disposed in the guiding rails 122c of the top plate 122 so that the connecting sheet 230 is capable of moving towards or away from the fastening section 211 and the fastening section 221 along a Y-axis of the coordinate system, and thereby forming a movable part of the protecting component 200. The pressed sheet spring 210 and the first blocking sheet spring 220 are bent or flattened simultaneously when the movable part moves relative to the top plate 122 of the cover 120.

In FIG. 3 and FIG. 4, both of the bending sections 212 and 222 of the pressed sheet spring 210 and the first blocking sheet spring 220 are bent. In detail, the bending section 212 of the pressed sheet spring 210 are protruded from the first surface 122a of the top plate 122 of the cover 120, and at least a part of the bending section 222 of the first blocking sheet spring 220 are protruded into the accommodating spaces 150 from the second surface 122b of the top plate 122. Furthermore, when the first blocking sheet spring 220 is bent, the bending section 222 is fixed into one of the notches 123a of the partition 123 and the bending section 222 is supported by the partition 123 so that the partition 123 favorably prevents the bending section 222 from deformation when the protecting component 200 is pushed by the power supply 300.

In this embodiment, the protecting component 200 further includes two second blocking sheet springs 240 located in the accommodating space 150. Each of the second blocking sheet springs 240 has a connecting end 241 and a fastening end 242 that are opposite to each other. The connecting end 241 is connected to the first blocking sheet spring 220. The fastening end 242 includes a second fastening component 243 which, for example, is a protrusion. When the first blocking sheet spring 220 is flattened, the first blocking sheet spring 220 drives the second blocking sheet spring 240 to move upward together, and the fastening component 243 passes through one of the first through holes 122e so as to abut against a side of the first fastening component 132 closer to the opening 160 of the accommodation space 150 than the other side, and thereby preventing the lid 130 from accidentally detached from the case 110 along the detaching direction (the positive direction of the X-axis).

In FIG. 4, the connecting end 241 of the second blocking sheet spring 240 is slantingly connected to the first blocking sheet spring 220. In detail, a distance D1 between the connecting end 241 and the opening 160 is less than a distance D2 between the fastening end 242 and the opening 160. Furthermore, a distance D3 between the connecting end 241 and the base 111 is greater than a distance D4 between the fastening end 242 and the base 111. Therefore, when the power supply 300 is inserted into the accommodating space 150 through the opening 160 with the lid 130 disposed on the case 110, the fastening end 242 is pressed by the power supply 300 so as to move upward to abut against the first fastening component 132.

In order to strengthen the protecting component 200, the protecting component 200 can include a first reinforcement sheet spring 250 and a second reinforcement sheet spring 260. The first reinforcement sheet spring 250 is connected to the connecting sheet 230 and the pressed sheet spring 210. The second reinforcement sheet spring 260 is connected to the connecting sheet 230 and the first blocking sheet spring 220. When the bending sections 212 and 222 of the pressed sheet spring 210 and the first blocking sheet spring 220 are bent or flattened, the first reinforcement sheet spring 250 and the second reinforcement sheet spring 260 are also bent or flattened simultaneously. That is, the connecting sheet 230 slides along the guiding rails 122c so as to bend or flatten the pressed sheet spring 210, the first blocking sheet spring 220, the first reinforcement sheet spring 250 and the second reinforcement sheet spring 260 simultaneously.

The power supply 300 is capable of being inserted into or removed from the accommodating space 150 through the opening 160 along the X-axis. An extending direction of the first sliding section 113a is intersected with a removing direction of the power supply 300 (the positive direction of the X-axis), and an extending direction of the second sliding section 113b is parallel to the removing direction. The power supply 300 is for electrically connected to the mother board (not shown in the drawings) in the case 110 as a power source.

In this embodiment, the detaching direction of the lid 130 is the same as the removing direction of the power supply 300 so that the second fastening component 243 of the second blocking sheet spring 240 is closer to the opening 160 than the first fastening component 132 of the lid 130; thereby the first fastening component 132 and the second fastening component 243 prevent the lid 130 from being accidentally detached from the case 110, but the disclosure is not limited thereto. In other embodiments, the detaching direction of the lid 130 is opposite to the removing direction of the power supply 300 so that the first fastening component 132 is closer to the opening 160 than the second fastening component 243, and the first fastening component 132 and the second fastening component 243 still prevent the lid 130 from being accidentally detached from the case 110.

Figure 6A:
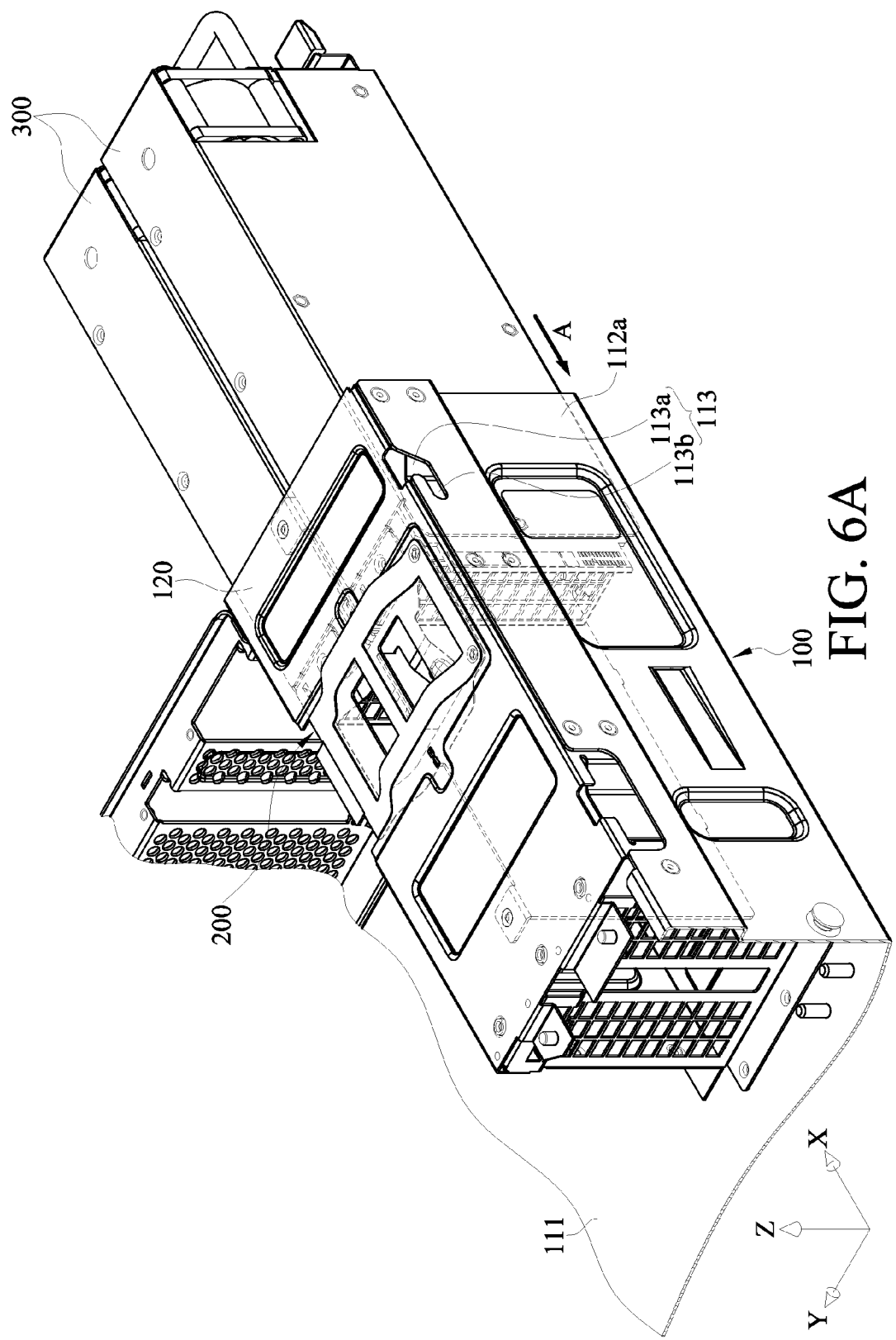
FIG. 6A is a perspective view of the server with the lid detached from the case and a part of two power supplies disposed in an accommodating space according to the first embodiment.
Figure 6B:
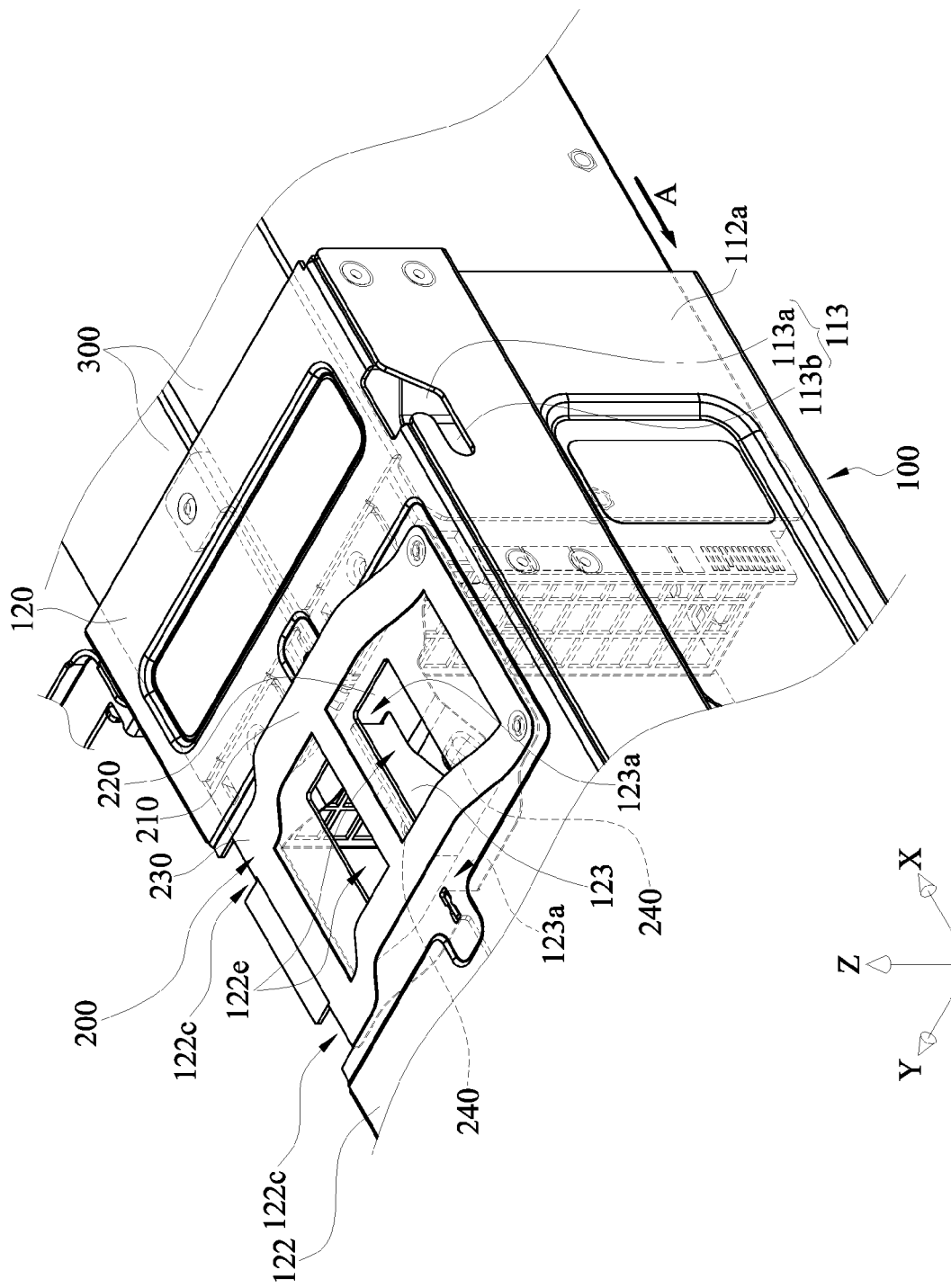
FIG. 6B is a partially perspective view of the server in FIG. 6A.
Figure 6C:
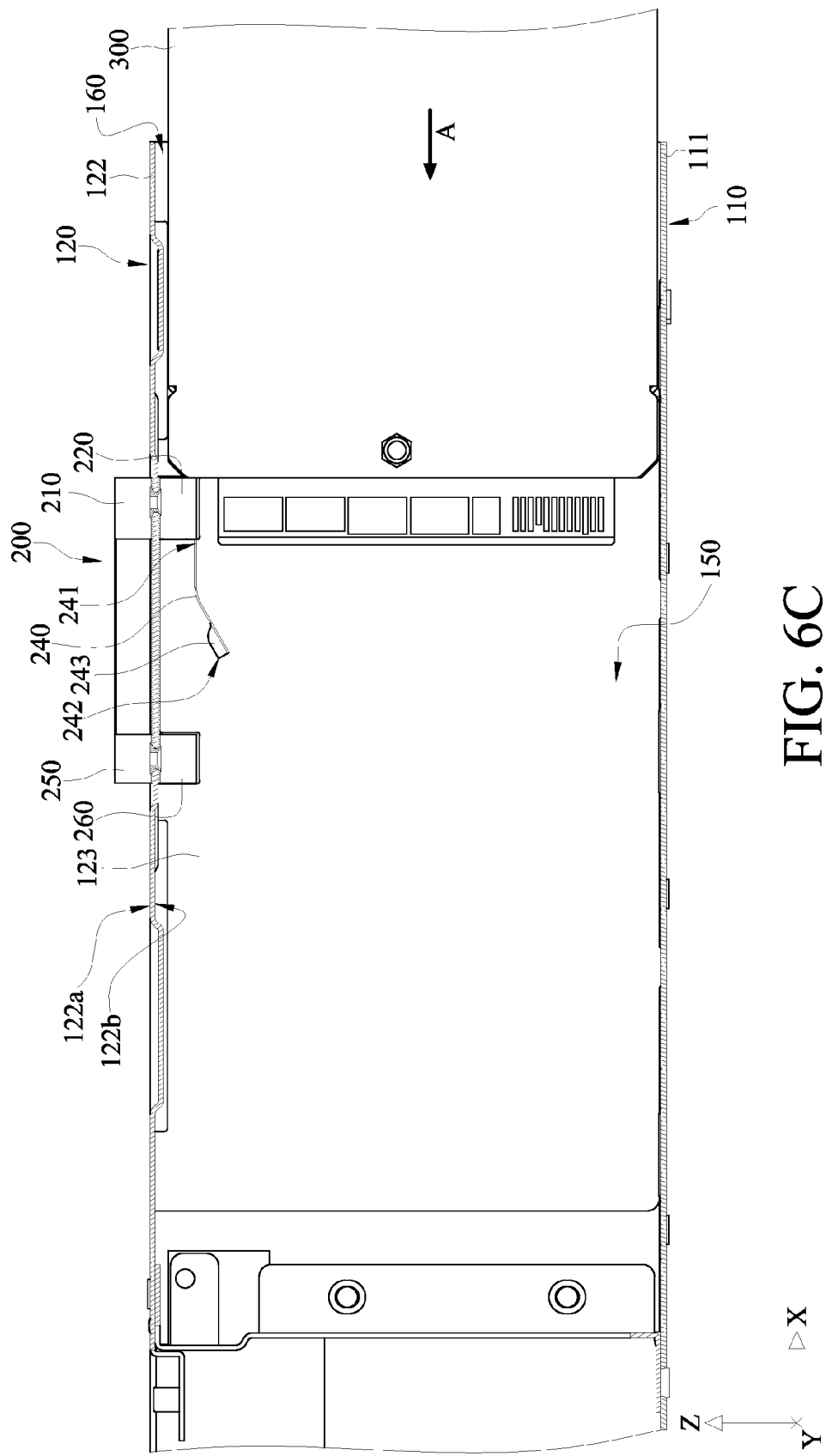
FIG. 6C is a cross-sectional view of the server in FIG. 6A.
Figure 7A:
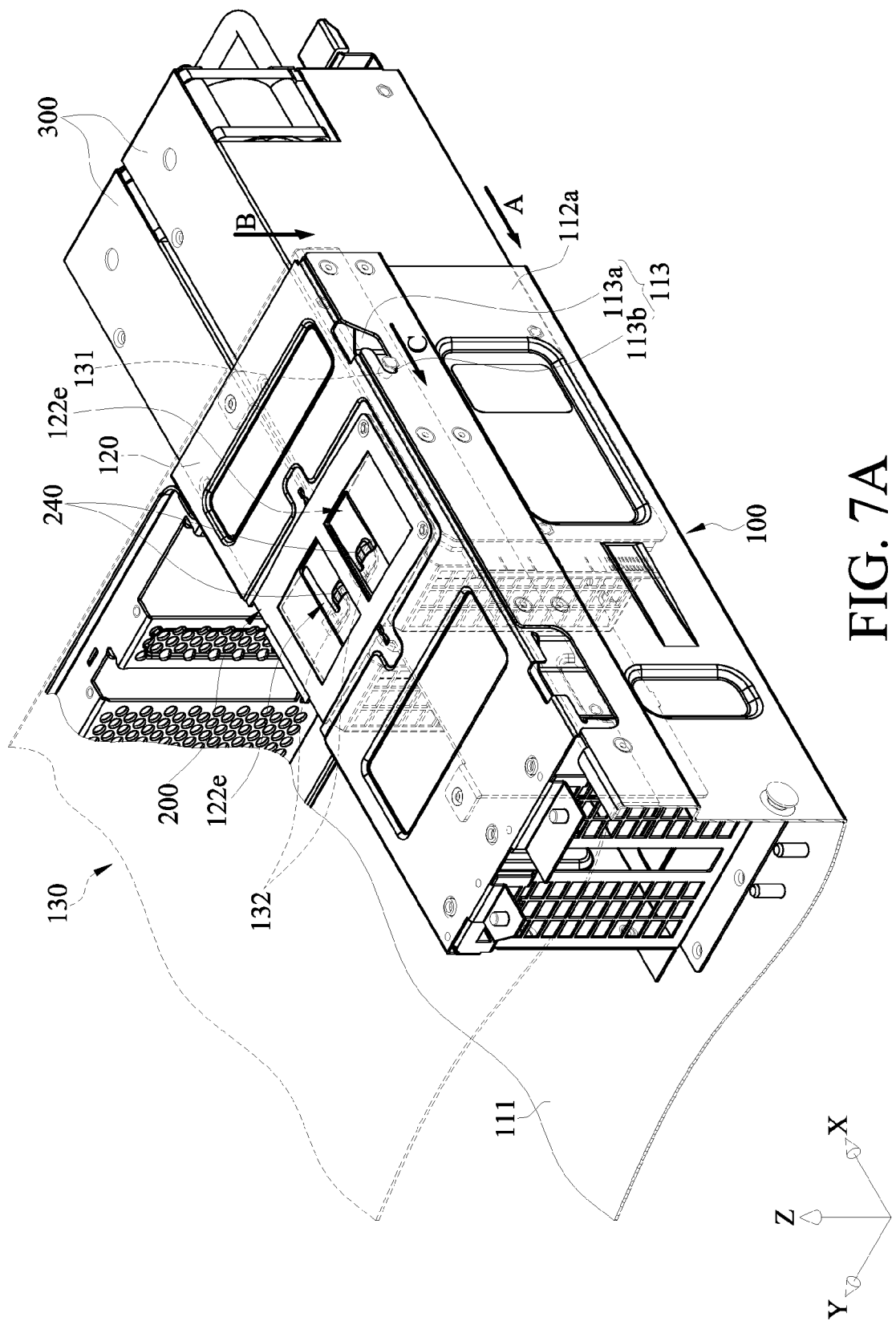
FIG. 7A is a perspective view of the server with the lid disposed on the case and most of the two power supplies disposed in the accommodating space according to the first embodiment.
Figure 7B:
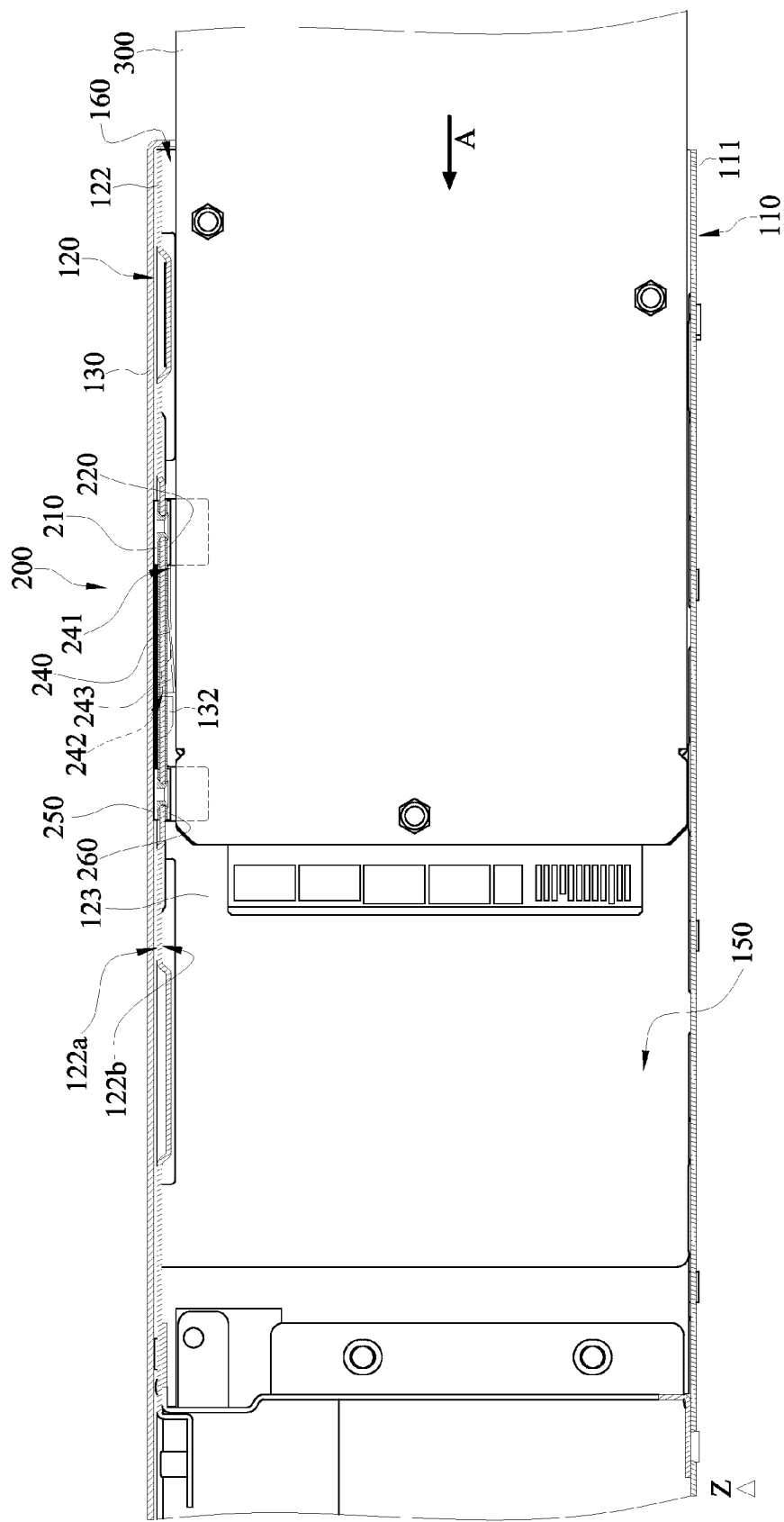
FIG. 7B is a cross-sectional view of the server in FIG. 7A.
Figure 8:
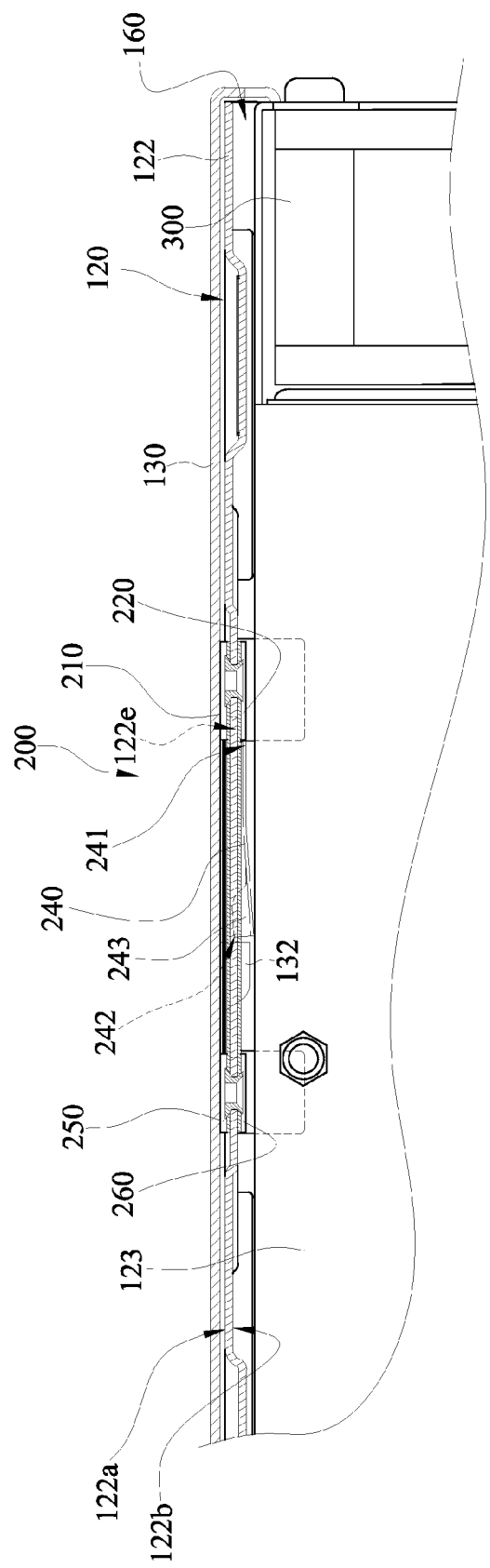
FIG. 8 is a cross-sectional view of the server with the lid disposed on the case and the power supplies disposed in the accommodating space according to the first embodiment.
Figure 9A:
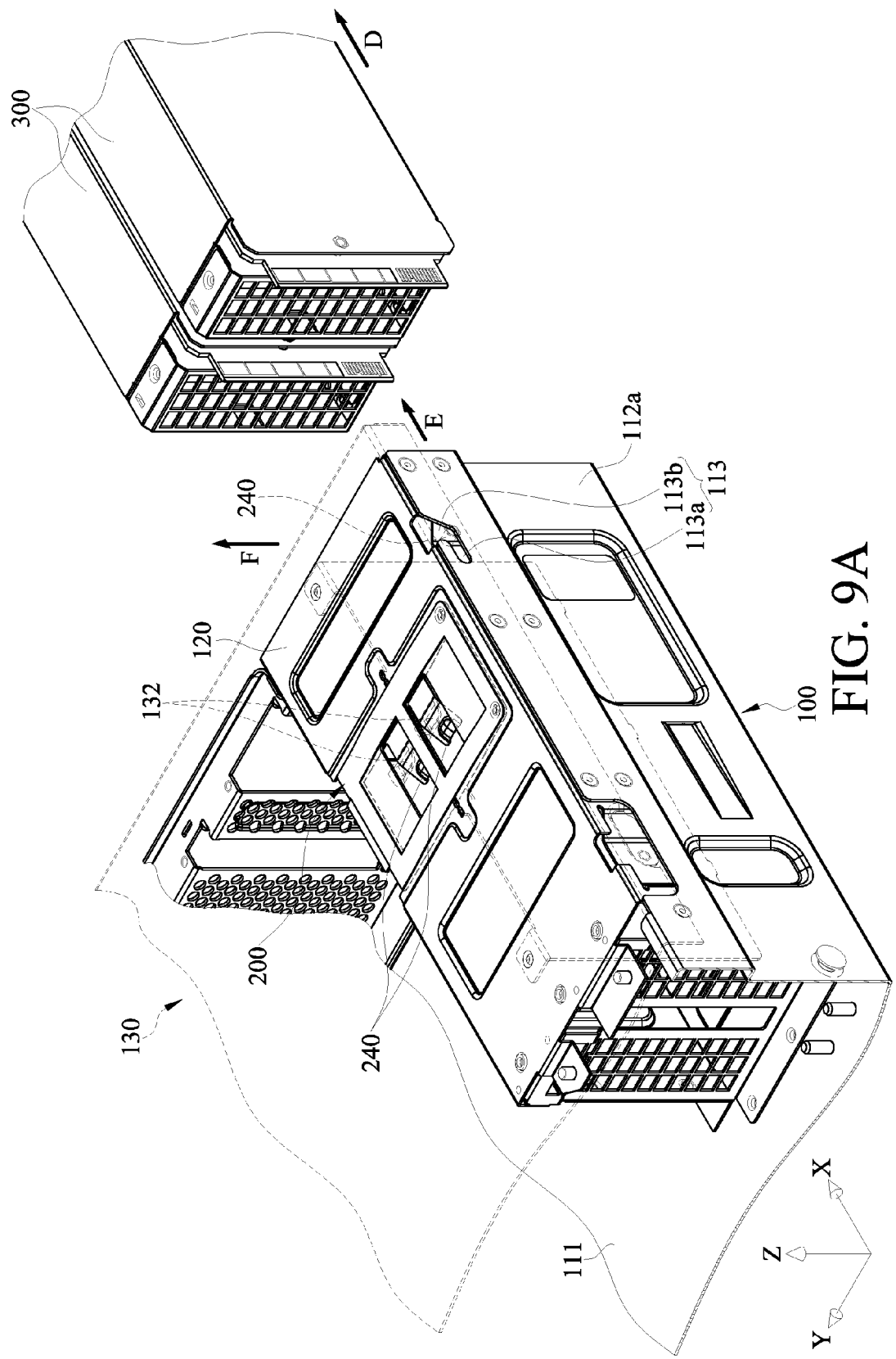
FIG. 9A is a perspective view of the server with the lid disposed on the case and the power supplies removed from the accommodating space according to the first embodiment.
Figure 9B:
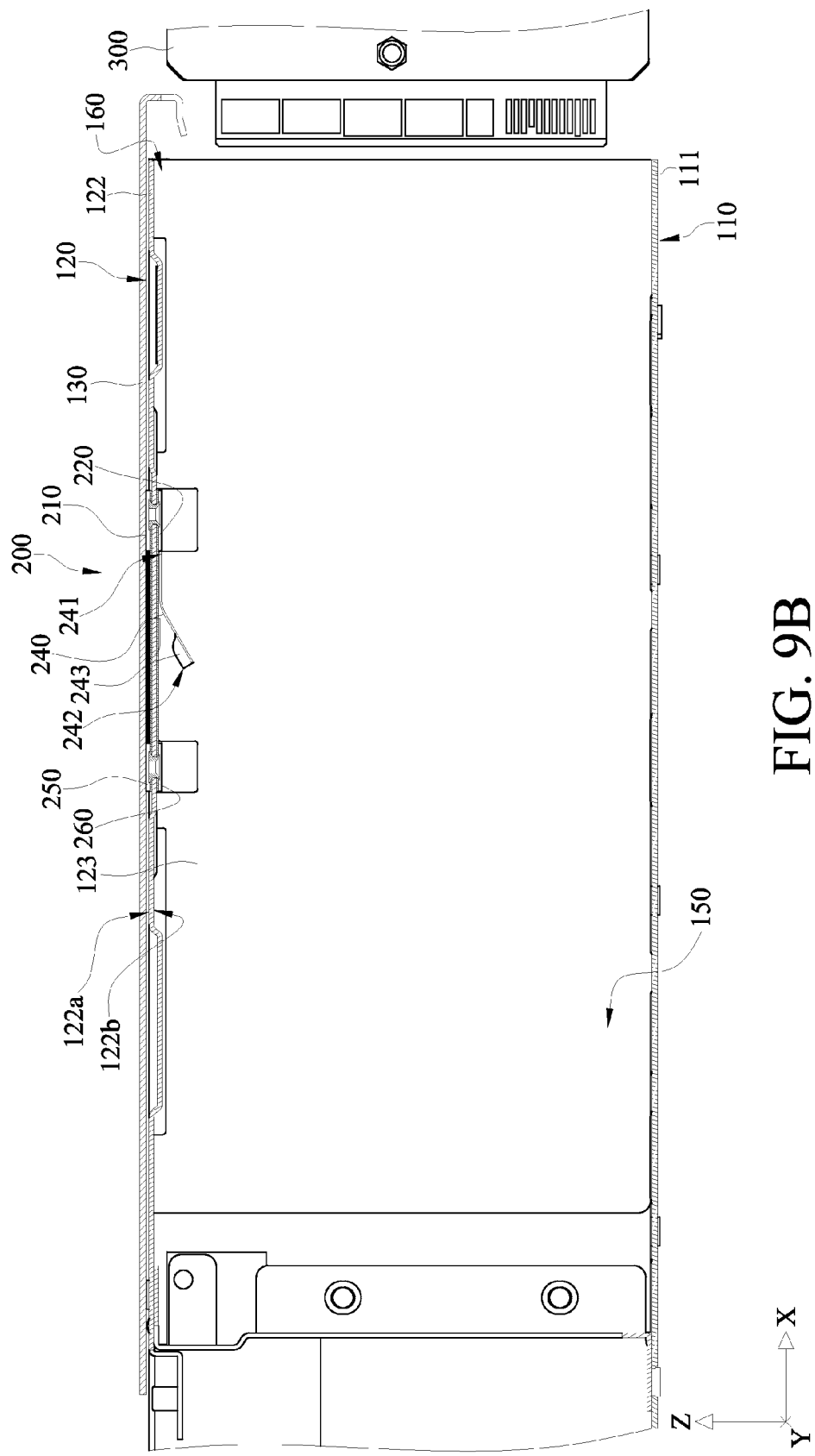
FIG. 9B is a cross-sectional view of the server in FIG. 9A.

Please refer to FIG. 6A to FIG. 9B. FIG. 6A is a perspective view of the server with the lid detached from the case and a part of two power supplies disposed in an accommodating space according to the first embodiment. FIG. 6B is a partially perspective view of the server in FIG. 6A. FIG. 6C is a cross-sectional view of the server in FIG. 6A. FIG. 7A is a perspective view of the server with the lid disposed on the case and most of the two power supplies disposed in the accommodating space according to the first embodiment. FIG. 7B is a cross-sectional view of the server in FIG. 7A. FIG. 8 is a cross-sectional view of the server with the lid disposed on the case and the power supplies disposed in the accommodating space according to the first embodiment. FIG. 9A is a perspective view of the server with the lid disposed on the case and the power supplies removed from the accommodating space according to the first embodiment. FIG. 9B is a cross-sectional view of the server in FIG. 9A.

In FIG. 6A and FIG. 6B, when the lid 130 is detached from the case 110, there is no any external force applied on the pressed sheet spring 210 and the first blocking sheet spring 220 so that the bending sections 212 and 222 are normally bent. Therefore, the bending sections 212 is protruded from the first surface 122a of the top plate 122, and the bending sections 222 is protruded into the accommodating space 150 from the second surface 122b.

When the power supply 300 is inserted into the accommodating space 150 along a direction of an arrow A, the bending sections 222 of the first blocking sheet spring 220 prevents the power supply 300 from being disposed in the accommodating space 150. That is, the bending sections 222 which is bent blocks the way for the installation of the power supply 300. Therefore, when the user tries to insert the power supply 300 into the accommodating space 150 with the lid 130 being detached from the case 110, the protecting component 200 is favorable for blocking the power supply 300 from electrically connected to the motherboard, and thereby preventing the user from electric shock.

In FIG. 7A and FIG. 7B, when the lid 130 slides along a direction of an arrow B and a direction of an arrow C in sequence to be disposed on the case 110, the bending section 212 of the pressed sheet spring 210 is pressed by the lid 130 so as to be flattened. The bending section 212 pressed by the lid 130 drives the connecting sheet 230 to slide away from the fastening section 211 along a positive direction of the Y-axis, and thereby the connecting sheet 230 flatten the bending section 222 of the first blocking sheet spring 220. When the bending section 222 is flattened, the bending section 222 is removed from the accommodating space 150 so that the power supply 300 is capable of being inserted into the accommodating space 150 along the direction of the arrow A. Therefore, the user is prevented from electric shock when the lid 130 is disposed on the case 110.

In FIG. 8, when the power supply 300 is located in the accommodating space 150, the power supply 300 pushes the fastening end 242 of the second blocking sheet springs 240 upward (along a positive direction of a Z-axis) so that the fastening end 242 is abutted against the side of the first fastening component 132 closer to the opening 160 than the other side. Therefore, the lid 130 is prevented from being detached along the positive directions of the X-axis and the Y-axis in sequence so as to further prevent the user from electric shock.

In FIG. 9A and FIG. 9B, when the power supply 300 is removed from the accommodating space 150 along a direction of an arrow D, the fastening end 242 of the second blocking sheet springs 240 is moved away from the first fastening component 132 along the negative direction of the Z-axis since the power supply 300 stops pushing the fastening end 242. Therefore, since the power supply 300 is removed, the user is capable of detaching the lid 130 along the directions of the arrow E and F in sequence without any risk of electric shock.

In this embodiment, the protecting component 200 is assembled on the top plate 122 of the cover 120, but the disclosure is not limited thereto. In other embodiments with the number of the accommodating space 150 is only one, the protecting component 200 can be assembled on the side plate 121, and the lid 130 can includes an extending plate extended towards the base 111. When the lid 130 is assembled on the case 110, the extending plate presses the bending section 212 of the pressed sheet spring 210 at the side plate 121.

Figure 10:
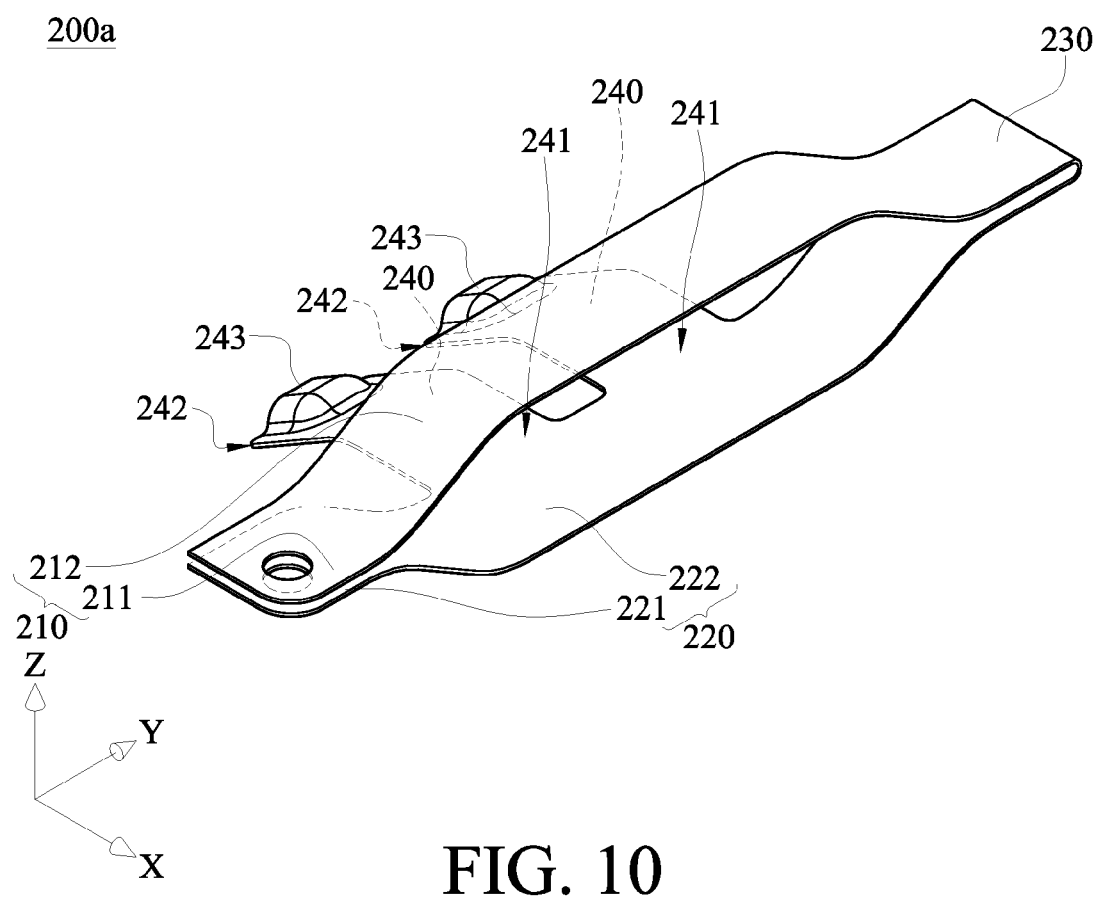
FIG. 10 is a perspective view of a protecting component according to a second embodiment.

The protecting component includes the pressed sheet spring, the first blocking sheet spring, the connecting sheet, the second blocking sheet spring, the first reinforcement sheet spring and the second reinforcement sheet spring in the first embodiment, but the disclosure is not limited thereto. Please refer to FIG. 10, which is a perspective view of a protecting component according to a second embodiment.

In this embodiment, a protecting component 200a includes the pressed sheet spring 210, the first blocking sheet spring 220, the connecting sheet 230 and the second blocking sheet spring 240. Specifically, the protecting component 200a includes without the first reinforcement sheet spring 250 and the second reinforcement sheet spring 260 which are shown in the first embodiment. The protecting component 200a is also bent or flattened by the lid 130, and such illustration can be referred to the description in the first embodiment.

Figure 11:
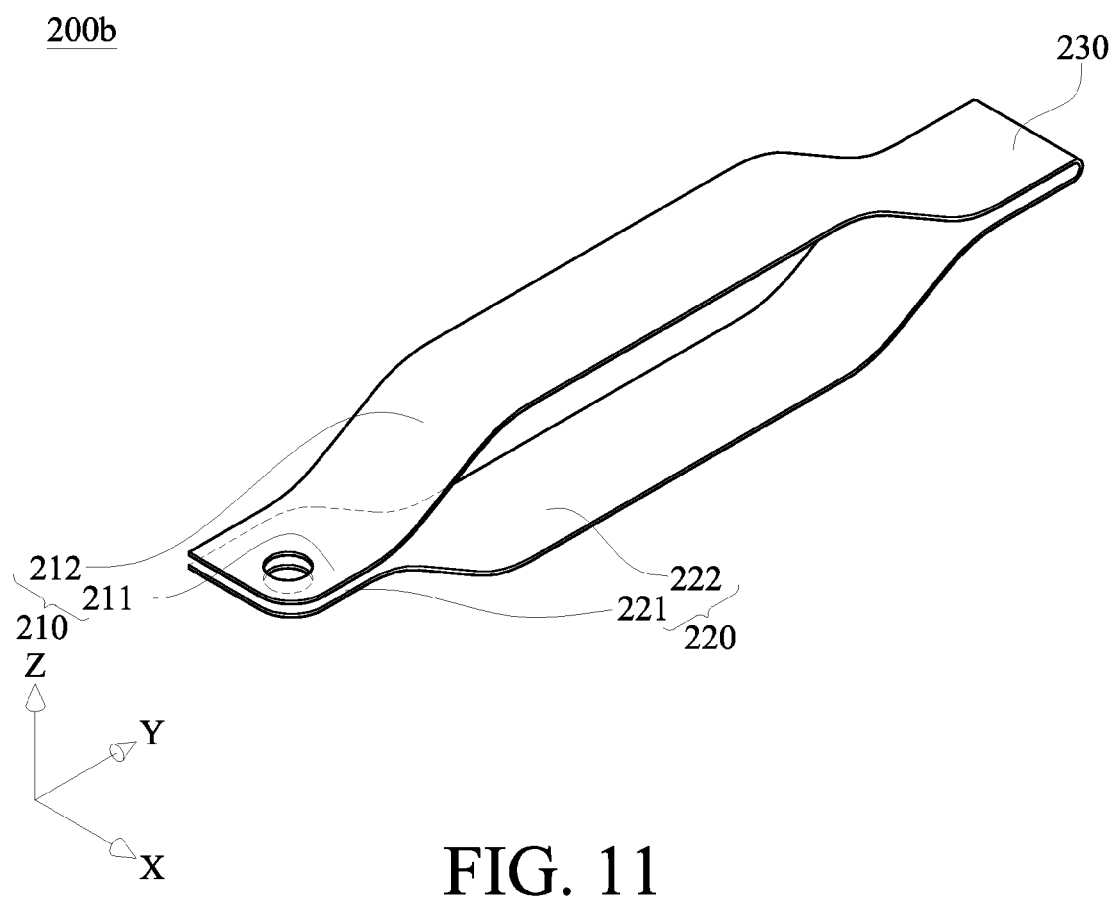
FIG. 11 is a perspective view of a protecting component according to a third embodiment.

FIG. 11 is a perspective view of a protecting component according to a third embodiment. In this embodiment, a protecting component 200b includes the pressed sheet spring 210, the first blocking sheet spring 220 and the connecting sheet 230. Specifically, the protecting component 200b includes without the second blocking sheet spring 240, the first reinforcement sheet spring 250 and the second reinforcement sheet spring 260 which are shown in the first embodiment. The protecting component 200b is also bent or flattened by the lid 130, and such illustration can be referred to the description in the first embodiment.

Figure 12:
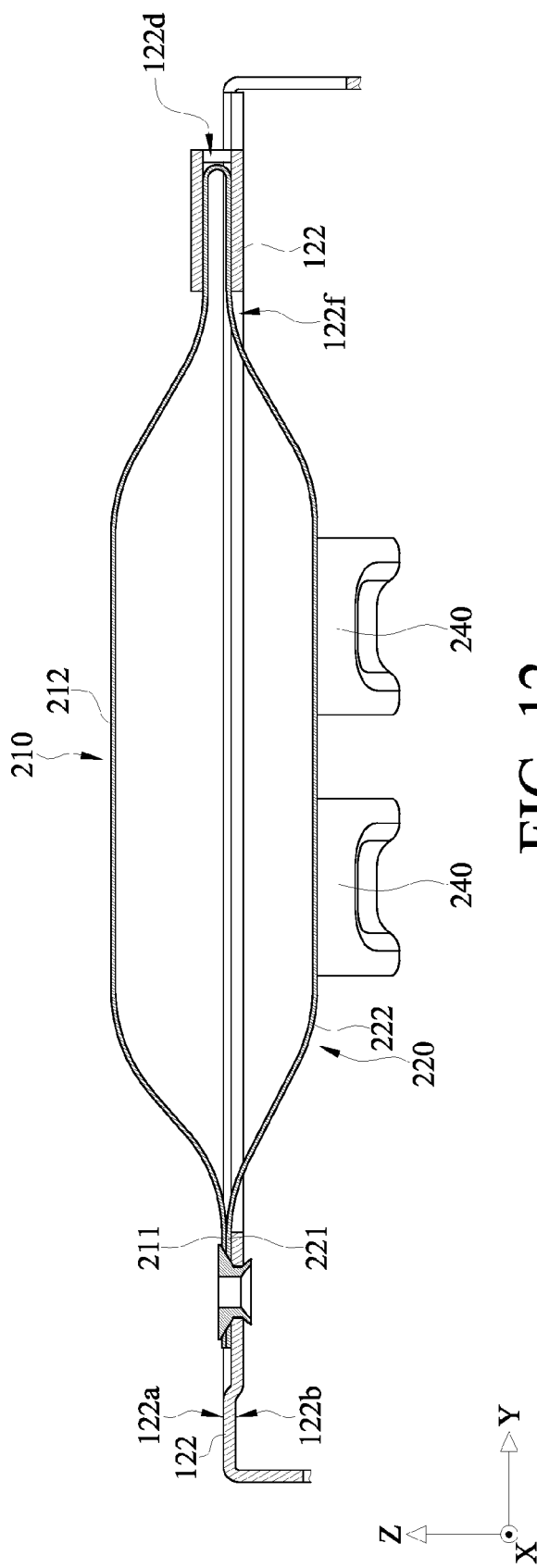
FIG. 12 is a cross-sectional view of a protecting component assembled on a cover according to a fourth embodiment.

In the first embodiment, the two bending sections of the pressed sheet spring and the first blocking sheet spring are located at two sides of the top plate that are opposite to each other, respectively, but the disclosure is not limited thereto. Please refer to FIG. 12, which is a cross-sectional view of a protecting component assembled on a cover according to a fourth embodiment.

In this embodiment, the top plate 122 has a guiding slot 122d located at a side of the top plate 122 further away from the base 111 than the other side. The top plate 122 further has a second through hole 122f located near the guiding slot 122d. The two bending sections 211 and 221 of the pressed sheet spring 210 and the first blocking sheet spring 220 are fastened to the side of the top plate 122 further away from the base 111 than the other side. The connecting sheet 230 of the protecting component 200 is slidably disposed in the guiding slot 122d so that the connecting sheet 230 is capable of moving towards or moving away from the fastening section 212 and the fastening section 222 along the Y-axis of the coordinate system, thereby forming a movable part of the protecting component 200. The pressed sheet spring 210 and the first blocking sheet spring 220 are bent or are flattened simultaneously when the movable part moves relative to the top plate 122 of the cover 120. Furthermore, when the bending sections 211 and 221 are bent, the bending section 212 is protruded from the first surface 122a of the top plate 122, and the bending section 222 is protruded into the accommodating spaces 150 from the second surface 122b of the top plate 122.

According to the disclosure, the server includes the protecting component, and the bending sections of the pressed sheet spring and the first blocking sheet spring of the protecting component are bent or flattened simultaneously. When the lid presses the bending section of the pressed sheet spring, both of the bending sections are flattened and the bending section of the first blocking sheet spring is removed from the accommodating space so that the power supply is capable of being inserted into the accommodating space. When the lid is removed, both of the bending sections are bent normally and the bending section of the first blocking sheet spring is protruded into the accommodating space so that the power supply is prevented from being inserted into the accommodating space. Therefore, when the user tries to insert the power supply into the accommodating space with the lid being detached from the case, the protecting component is favorable for preventing the user from electric shock.

Furthermore, the second blocking sheet spring is slantingly connected to the first blocking sheet spring. When the lid is disposed on the case and the power supply is inserted into the accommodating space, the fastening end of the second blocking sheet spring is pressed by the power supply so as to move upward to abut against the first fastening component of the lid. Therefore, it is favorable for preventing the lid from being detached by the user when the power supply is located in the accommodating space, and thereby further preventing the user from electric shock.

What is claimed is:

1. A server, comprising:
    a chassis comprising a case, a cover and a lid, the cover disposed on the case so as to form at least one accommodating space, and the lid detachably disposed on the case and covering the cover;
    a protecting component assembled on the cover, the protecting component comprising a pressed sheet spring and a first blocking sheet spring, both the pressed sheet spring and the first blocking sheet spring comprising a bending section, and the bending sections facing each other with a distance between the bending sections; an end of the pressed sheet spring and an end of the first blocking sheet spring both fastened to the cover together so as to form a fastening part, the other end of the pressed sheet spring and the other end of the first blocking sheet spring connected to each other so as to form a movable part, the pressed sheet spring and the first blocking sheet spring being bent or flattened simultaneously when the movable part being moved relative to the cover; and
    at least one power supply removably disposed in the at least one accommodating space, when the lid being detached from the case, the bending sections being normally bent so that at least a part of the bending section of the first blocking sheet spring protruded into the at least one accommodating space so as to prevent the at least one power supply from being disposed in the at least one accommodating space; when the lid being disposed on the case, the lid pressing the bending section of the pressed sheet spring so as to drive the movable part to move relative to the cover, and thereby the bending sections being flattened due to movement of the movable part, the bending section of the first blocking sheet spring being flattened so as to be removed from the at least one accommodating space, and thereby the at least one power supply being capable of being disposed in the at least one accommodating space.

2. The server according to claim 1, wherein the protecting component further comprises a connecting sheet, the connecting sheet connects the pressed sheet spring and the first blocking sheet spring so as to form the movable part together, both the pressed sheet spring and the first blocking sheet spring further comprise a fastening section, the fastening sections are fastened to the cover so as to form the fastening part together; when the lid is detached from the case, the bending sections of the pressed sheet spring and the first blocking sheet spring protrude from the cover along two opposite directions, respectively, so that the bending section of the pressed sheet spring is protruded away from the at least one accommodating space and the bending section of the first blocking sheet spring is protruded into the at least one accommodating space; when the lid is disposed on the case, the pressed sheet spring is flattened by the lid so that the bending sections of the pressed sheet spring and the first blocking sheet spring move towards each other.

3. The server according to claim 1, wherein a detaching direction of the lid is parallel to a removing direction of the at least one power supply removed from the at least one accommodating space, the lid comprises a first fastening component, and the protecting component further comprises a second blocking sheet spring extending towards the at least one accommodating space; when the at least one power supply is disposed in the at least one accommodating space, the at least one power supply pushes the second blocking sheet spring upward so that the second blocking sheet spring is fastened to the first fastening component of the lid.

4. The server according to claim 3, wherein the second blocking sheet spring has a connecting end and a fastening end, the connecting end is slantingly connected to the first blocking sheet spring, and the fastening end comprises a second fastening component which is fastened to the first fastening component of the lid.

5. The server according to claim 4, wherein the at least one accommodating space has an opening, the at least one power supply is inserted into the at least one accommodating space through the opening, a distance between the connecting end and the opening is less than a distance between the fastening end and the opening.

6. The server according to claim 4, wherein the detaching direction of the lid is the same as the removing direction of the at least one power supply, both the first fastening component and the second fastening component are a protrusion, the second fastening component abuts against a side of the first fastening component close to the opening when the lid is disposed on the case.

7. The server according to claim 2, wherein the case comprises a base and a side board standing on the base, a plurality of sliding grooves are formed on a top edge of the side board, each of the plurality of sliding grooves comprises a first sliding section and a second sliding section, an extending direction of the first sliding section and the removing direction intersect with each other, and an extending direction of the second sliding section is parallel to the removing direction; the lid comprises a plurality of sliders, the plurality of sliders are slidably disposed in the plurality of sliding grooves, respectively, the slider slides into the second sliding section through the first sliding section so as to dispose the lid on the case, the slider slides out of the sliding groove through the first sliding section so as to detach the lid from the case.

8. The server according to claim 7, wherein the cover comprises a side plate and a top plate, the side plate stands on the base of the case, the top plate connects the side plate and the side board, there is a distance between the top plate and the base, the fastening sections of the pressed sheet spring and the first blocking sheet spring are fastened to the top plate, and the connecting sheet is slidably disposed on the top plate.

9. The server according to claim 8, wherein the top plate has a first surface and a second surface that are opposite to each other, the second surface faces the base of the case, the bending section of the pressed sheet spring protrudes from the first surface when the bending sections are bent, and the bending section of the first blocking sheet spring protrudes from the second surface when the bending sections are bent.

10. The server according to claim 8, wherein the fastening section of the pressed sheet spring and the fastening section of the first blocking sheet spring are located at two sides of the top plate that are opposite to each other, respectively.

11. The server according to claim 8, wherein the top plate has a guiding rail, and the connecting sheet is slidably disposed in the guiding rail.

12. The server according to claim 8, wherein both of the fastening sections of the pressed sheet spring and the first blocking sheet spring are located at a side of the top plate.

13. The server according to claim 9, wherein the top plate has a guiding slot located at a side of the top plate away from the base, the top plate further has a through hole located near the guiding slot, the connecting sheet of the protecting component is slidably disposed in the guiding slot, the bending section of the first blocking sheet spring passes through the through hole and protrudes into the at least one accommodating space.

14. The server according to claim 2, wherein the protecting component further comprises a first reinforcement sheet spring and a second reinforcement sheet spring, the first reinforcement sheet spring is connected to the connecting sheet and the pressed sheet spring, the second reinforcement sheet spring is connected to the connecting sheet and the first blocking sheet spring; when the bending sections of the pressed sheet spring and the first blocking sheet spring move towards each other, the first reinforcement sheet spring and the second reinforcement sheet spring are driven by the connecting sheet to move towards each other.

15. The server according to claim 8, wherein the cover further comprises at least one partition standing on the base of the case, the at least one partition is located between the top plate of the cover and the base of the case so that the number of the accommodating space is plural; the at least one partition has a notch located at an edge of the partition away from the base, and the bending section of the first blocking sheet spring is located in the notch when the lid is detached from the case.

* * * * *